(12) United States Patent
Iwasaki

(10) Patent No.: US 8,432,754 B2
(45) Date of Patent: Apr. 30, 2013

(54) MEMORY CONTROL APPARATUS AND MASK TIMING ADJUSTING METHOD

(75) Inventor: Keiichi Iwasaki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 168 days.

(21) Appl. No.: 13/049,695

(22) Filed: Mar. 16, 2011

(65) Prior Publication Data
US 2011/0228619 A1 Sep. 22, 2011

(30) Foreign Application Priority Data

Mar. 17, 2010 (JP) ................... 2010-061185

(51) Int. Cl.
G11C 7/00 (2006.01)

(52) U.S. Cl.
USPC ............ 365/193; 365/233.1; 365/189.06; 365/191; 365/194

(58) Field of Classification Search .......... 365/193, 365/233.1, 189.06, 191, 194
See application file for complete search history.

(56) References Cited

U.S. PATENT DOCUMENTS

| | | | |
|---|---|---|---|
| 5,828,384 A | 10/1998 | Iwasaki et al. | |
| 6,922,367 B2 | 7/2005 | Morzano et al. | |
| 7,161,854 B2 | 1/2007 | Iwasaki | |
| 7,518,946 B2 | 4/2009 | Iwasaki | |
| 7,567,880 B2 * | 7/2009 | Iizuka | 702/106 |
| 7,664,904 B2 | 2/2010 | Oshikiri et al. | |
| 7,685,393 B2 | 3/2010 | Gillingham et al. | |
| 7,698,484 B2 | 4/2010 | Ikeda et al. | |
| 7,864,626 B2 | 1/2011 | Fujiwara | |
| 8,228,747 B2 * | 7/2012 | Onishi | 365/194 |
| 2005/0286320 A1 | 12/2005 | Iwasaki | |
| 2008/0043782 A1 | 2/2008 | Skerlj et al. | |
| 2008/0094918 A1 | 4/2008 | Fujizoe | |
| 2010/0182856 A1 * | 7/2010 | Koshizuka | 365/193 |
| 2011/0019489 A1 * | 1/2011 | Huang et al. | 365/193 |

FOREIGN PATENT DOCUMENTS

| | | |
|---|---|---|
| JP | 2002-152282 A | 5/2002 |
| JP | 2004-120027 A | 4/2004 |
| JP | 2006-13990 A | 1/2006 |
| JP | 2006-164099 A | 6/2006 |
| JP | 2006-172395 A | 6/2006 |
| JP | 2007-87082 A | 4/2007 |
| JP | 2007-87083 A | 4/2007 |
| JP | 2007-193454 A | 8/2007 |
| JP | 2007-226308 A | 9/2007 |
| JP | 2007-226561 A | 9/2007 |
| JP | 2007-228145 A | 9/2007 |
| JP | 2007-272871 A | 10/2007 |

(Continued)

Primary Examiner — Toan Le
Assistant Examiner — Hai Pham
(74) Attorney, Agent, or Firm — Dickstein Shapiro LLP

(57) ABSTRACT

A disclosed synchronous memory control apparatus for enabling reception of data read from a memory circuit in synchronism with a strobe signal from the memory circuit includes a mask circuit masking the strobe signal using a mask signal; a timing measuring circuit delaying the strobe signal in plural units of delay and latching data of each of the delayed strobe signals; and a mask generating circuit generating the mask signal. The timing measuring circuit latches the data of each of the delayed strobe signals at the first rise edge of the corresponding masked strobe signal. The mask generating circuit includes a delay circuit having plural units of delay. A start timing of the mask signal is adjusted in synchronism with an internal clock, and a signal having a delay amount corresponding to a selected unit of delay by the delay circuit is outputted as the mask signal.

6 Claims, 11 Drawing Sheets

FOREIGN PATENT DOCUMENTS

| | | |
|---|---|---|
| JP | 2007-529082 A | 10/2007 |
| JP | 2008-047118 A | 2/2008 |
| JP | 2008-71249 A | 3/2008 |
| JP | 2008-103013 A | 5/2008 |
| JP | 2008-250841 A | 10/2008 |
| JP | 2009-70150 A | 4/2009 |
| JP | 2009-541868 A | 11/2009 |

* cited by examiner

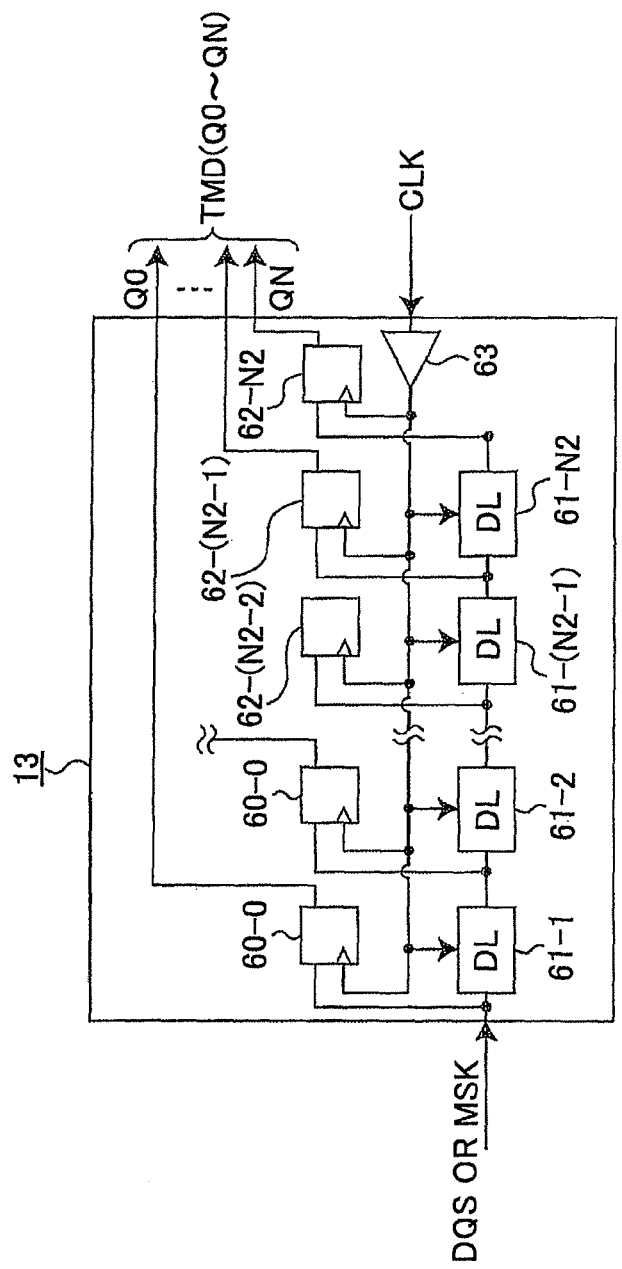

TMD($t_a$=(N-1)CLK)  xxxx00000000000000000

TMD($t_b$=(N)CLK)    00001111111111100000000

MEMORY CONTROL APPARATUS AND MASK TIMING ADJUSTING METHOD

BACKGROUND OF THE INVENTION

1. Field of the Invention

The present invention relates to source-synchronous type data reception and particularly to a memory control apparatus and a mask timing adjusting method.

2. Description of the Related Art

A Double Data Rate Synchronous Dynamic Random Access Memory (DDR-SDRAM) performs a write operation and a read operation by using a bi-directional data bus and a strobe signal. In the read operation, a required number of sets of strobe edges (rise and fall edges) are outputted following a high-impedance state ("Hi-Z state") and a "preamble" state of the strobe signal. Finally, the strobe signal returns to the Hi-Z state after a postamble state. A read data receive circuit needs to detect the preamble state and capture a strobe signal edge as a clock for data reception.

For example, Patent Document 1 discusses a snap-shot data training method for determining the optimum timing of a DQS enable signal in a single read operation. A sequence of Gray code counts is first written into a memory and then read in a single burst. A controller samples the read burst at a constant interval from the time the command was issued, and determines a loop-around delay. By searching a simple truth table, the optimum DQS enable timing for a normal read is determined. During a normal read operation, it is preferable to sample a counter that is enabled each time a command is issued, by using the first positive edge of the enabled DQS signal. If the counter sample changes, indicating a timing drift, the DQS enable signal can be adjusted to compensate for the variation and maintain a position at the center of the DQS preamble.

Patent Document 2 discusses a receive window position determining method and apparatus. The receive window position determining method involves determining whether a signal to be received within the receive window is within a reduced window within the receive window, the reduced window being shorter in length than the receive window. The shifting of signals to be received within the receive window can be detected early.

Patent Document 3 discusses a memory interface circuit capable of preventing an erroneous operation due to noise by acquiring data using a data strobe signal. A delay circuit delays the data strobe signal DQS and outputs a delay signal. An AND circuit performs a logical AND operation of the delay signal and the data strobe signal DQS and outputs an operation result as a first strobe signal DQSd. The first strobe signal DQSd is inputted into an inverter circuit, which outputs a second strobe signal Ddx complimentary to the first strobe signal DQSd. Based on the first strobe signal DQSd, a first flip-flop latches data DQ, while a second flip-flop latches the data DQ based on the second strobe signal Ddx.

Patent Document 4 discusses a memory controller capable of receiving a strobe signal outputted by a memory correctly as a reception clock regardless of the amount of delay on the board. The memory control apparatus includes a bi-directional buffer capable of turning on or off termination resistors. The resistance values of termination resistors on the pull-up side and the pull-down side can be controlled to be different values. The bi-directional buffer is used for transmission and reception of a strobe signal.

Patent Document 5 discusses an interface circuit for eliminating an unstable operation due to delay variations of a data strobe signal. A control circuit is fed with a read request signal Read_RQ for memory data read and a burst-length information signal BL for the read request. The control circuit controls a pullup circuit such that the data strobe signal DQS is pulled-up when the read request signal Read_RQ is active. Upon detection of transition of the data strobe signal DQS from H level to L level, a mask signal Enable is put in an unmasked state. Upon detection of a repetition of predetermined transitions of the data strobe signal DQS based on the burst-length information signal BL, the mask signal Enable is put in a mask state. By the repetition of such transitions, a postamble of the data strobe signal DQS is started. After the end of the postamble period, the data strobe signal DQS is pulled-up to H level.

However, the timing of input of the preamble is influenced by a wiring delay in the command system (such as clock, CS, RAS/CAS/WE, and address) between the memory control circuit and the memory and a wiring delay in the data system (such as strobe and data buses).

Delay data caused by the memory control circuit or the memory also vary due to voltage or temperature variations, thus affecting the timing of the preamble. Thus, for stable reception of read data, the preamble needs to be detected without being affected by the above causes for variations. If the unstable state of Hi-Z of the strobe signal is captured by the receive circuit, data may be read at a wrong timing or the receive circuit may hang up. Particularly, the problem becomes more serious in higher-speed memory systems, such as DDR2-SDRAM and DDR3-SDRAM.

In the case of Patent Document 1, the preamble state is determined by reading an internal counter that operates by a multiply-by-four clock (where the unit of clock corresponds to the clock inputted into the memory, or a clock with the same frequency), and a Gray code that is written to memory in advance. Patent Document 1 discusses a "training sequence" performed during initial setting, which does not include adjustments for the voltage or temperature variations that may be caused after the initial setting. The technology of Patent Document 1 also requires a clock four times the memory clock.

In the case of Patent Document 2, the receive window corresponds to the period in which the strobe signal is enabled, and the reduced window corresponds to a period between the first valid strobe rise and the last valid strobe fall where a certain relationship between the windows is maintained using a delay and the like. Thus, the problem of capturing the unstable state of the strobe signal during an adjusting procedure is not overcome.

In the case of Patent Document 3, a method is provided for eliminating the unstable state of the strobe signal by using a signal obtained after performing a logic operation between the strobe signal and the delayed strobe signal. Patent Document 3 does not discuss a specific method of dealing with the development of plural edges in an unstable state, nor a method for obtaining a valid period of the strobe signal.

In the case of Patent Document 4, the memory controller may enable the reception of the strobe signal outputted by the memory correctly as a reception clock regardless of the amount of delay on the board. However, the technology is not capable of adjusting the strobe signal accurately on the time axis.

In the case of Patent Document 5, the strobe signal and the mask signal are controlled based on the burst-length information signal indicating the burst length. Thus, the strobe signal cannot be adjusted accurately on the time axis.

Patent Document 1: Japanese Laid-open Patent Publication No. 2009-541868
Patent Document 2: Japanese Laid-open Patent Publication No. 2008-047118
Patent Document 3: Japanese Laid-open Patent Publication No. 2008-250841
Patent Document 4: Japanese Laid-open Patent Publication No. 2009-070150
Patent Document 5: Japanese Laid-open Patent Publication No. 2008-103013

SUMMARY OF THE INVENTION

In one aspect, a synchronous memory control apparatus for enabling the reception of data read from a memory circuit in synchronism with a strobe signal from the memory circuit includes a mask circuit masking the strobe signal using a mask signal; a timing measuring circuit delaying the strobe signal in plural units of delay and latching data of each of the delayed strobe signals; and a mask generating circuit generating the mask signal. The timing measuring circuit latches the data of each of the delayed strobe signals at the first rise edge of the corresponding masked strobe signal. The mask generating circuit controls the generation of the mask signal in accordance with a signal from a command control circuit of the memory circuit. The mask generating circuit further includes a delay circuit having plural units of delay, the mask generating circuit adjusting a start timing of the mask signal in synchronism with an internal clock, and outputting a signal having a delay amount corresponding to a selected unit of delay by the delay circuit as the mask signal.

In another aspect, a mask timing adjusting method is performed in a synchronous memory control apparatus for enabling the reception of data read from a memory circuit in synchronism with a strobe signal from the memory circuit. The apparatus includes a mask circuit masking the strobe signal using a mask signal; a timing measuring circuit delaying the strobe signal in plural units of delay and latching data of each of the delayed strobe signals; and a mask generating circuit generating the mask signal. The timing measuring circuit latches the data of each of the delayed strobe signals at the first rise edge of the corresponding masked strobe signal, and the mask generating circuit controls the generation of the mask signal in accordance with a signal from a command control circuit of the memory circuit. The mask timing adjusting method includes detecting a preamble period by adjusting the mask signal outputted from the mask generating circuit at a timing synchronized with the internal clock; adjusting the mask signal outputted from the mask generating circuit in the units of delay of the delay circuit in the mask generating circuit such that the timing of the strobe signal is within the detected preamble period; and outputting the adjusted mask signal.

BRIEF DESCRIPTION OF THE DRAWINGS

FIG. 3B is a block diagram of a timing measuring circuit of the memory control system of FIG. 2;

DETAILED DESCRIPTION OF THE PREFERRED EMBODIMENTS

Figure 1:
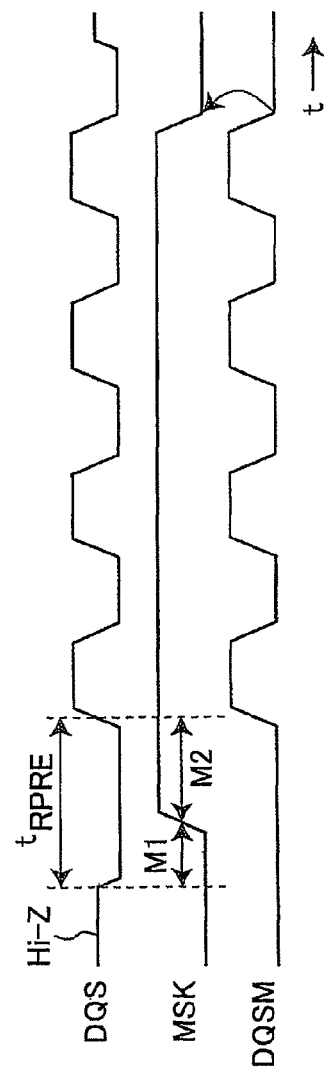
FIG. 1 is a timing chart according to an embodiment.

Referring now to the drawings, wherein like reference numerals designate identical or corresponding parts throughout the several views, FIG. 1 is a timing chart according to an embodiment of the present invention, where the CL value of DDR-SDRAM 2 is 2. In the example of FIG. 1, in a preamble period $t_{RPRE}$ before the strobe signal DQS rises after being changed from the Hi-Z state to a low level, a mask signal MSK is raised to the high level (where the mask is cancelled; i.e., the strobe signal DQS is enabled). Further, the mask signal MSK is raised to the high level at an appropriate timing (where a predetermined first margin period M1 ends after the entry of the strobe signal DQS from the high-impedance state into the preamble period $t_{RPRE}$, and where a predetermined second margin period M2 begins before the strobe signal DQS is raised to the high level).

Figure 9:
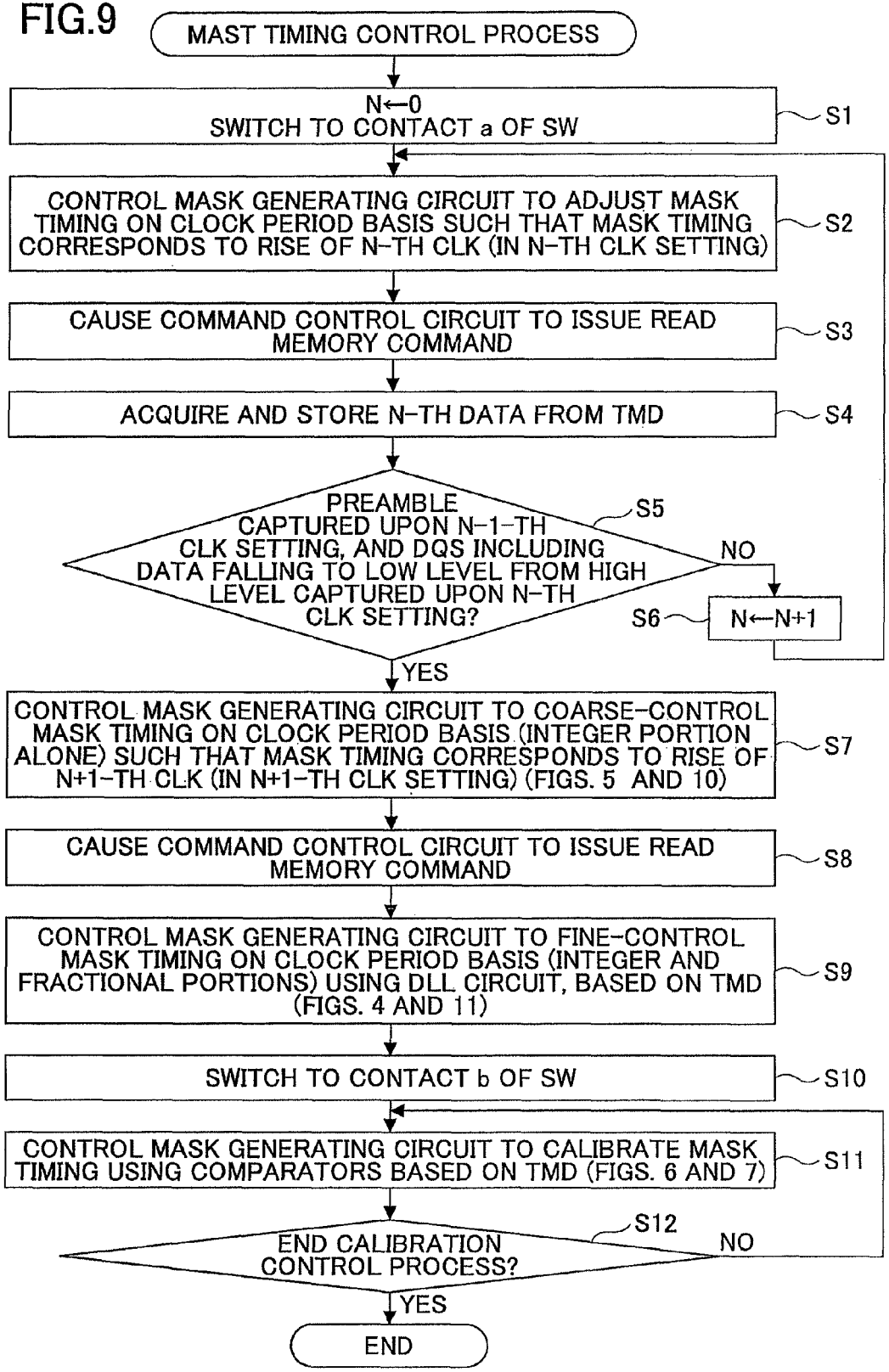
FIG. 9 is a flowchart of a mask timing control process in the memory control system of FIG. 2.

In accordance with the present embodiment, as illustrated by a mask timing control process of FIG. 9, the mask timing is adjusted by performing a coarse adjustment, a fine adjustment, and calibration on the mask timing. The timing of fall of the mask signal MSK adjusted by a predetermined circuit (not illustrated) such that the strobe signal DQS after masking (hereafter referred to as a "masked strobe signal DQSM) corresponds to the last masked strobe signal DQSM for obtaining a desired edge.

Figure 2:
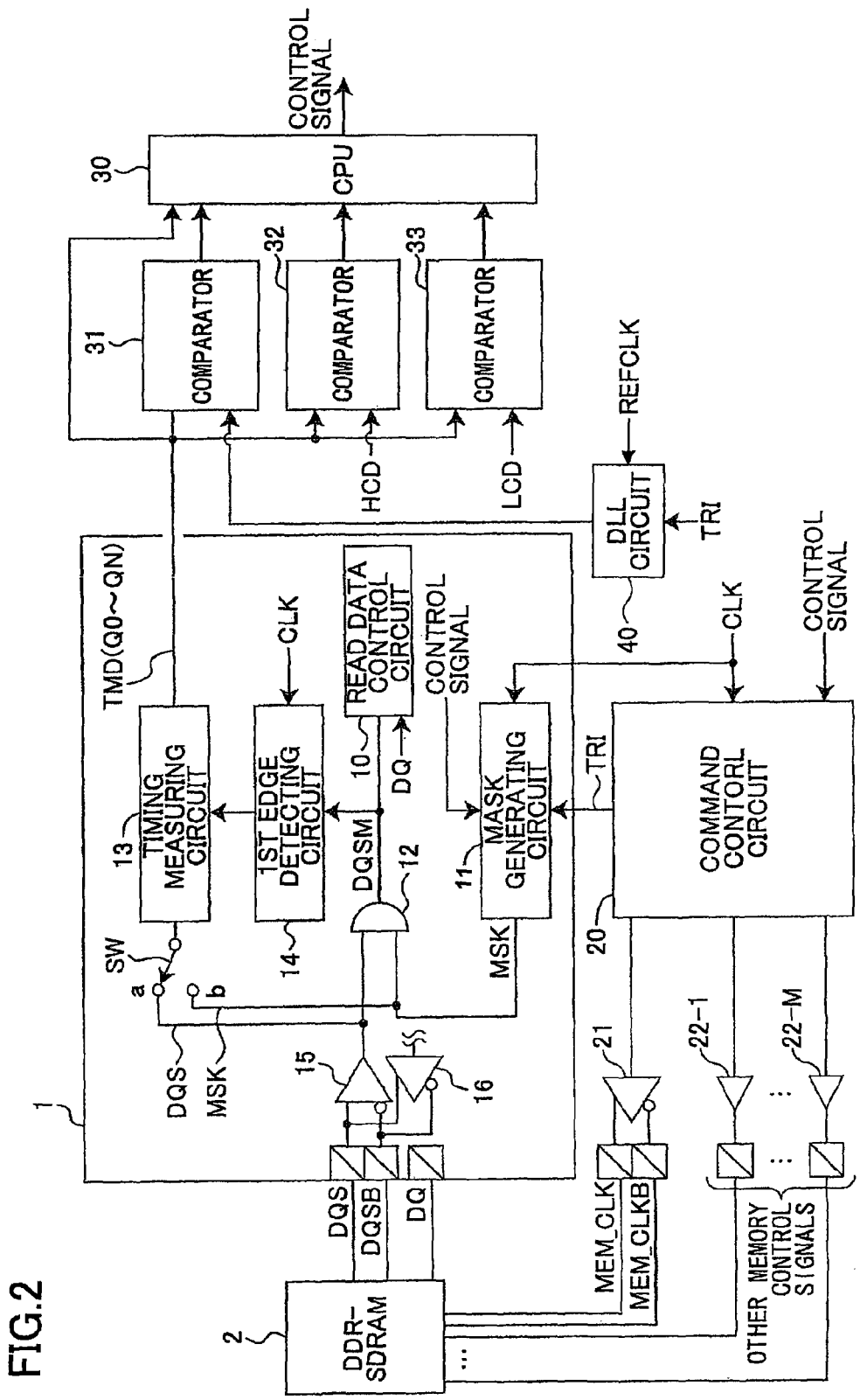
FIG. 2 is a block diagram of a memory control system including a memory control apparatus according to an embodiment.

FIG. 2 is a block diagram of a memory control system including a memory control apparatus 1 according to an embodiment. In FIG. 2, the memory control apparatus 1, in cooperation with a command control circuit 20 that generates clock and other memory control signals for a DDR-SDRAM (which may be hereafter referred to as a "SDRAM") 2 by a source-synchronous method, controls a write to or a read from the SDRAM 2.

An internal clock CLK is inputted into the command control circuit 20 and the memory control apparatus 1. A control signal from a CPU 30 of an external (or internal) controller may be inputted into the command control circuit 20 and a mask generating circuit 11 in the memory control apparatus 1. When the command control circuit 20 issues a read command for reading data based on a control signal from the CPU 30, the command control circuit 20 produces a trigger signal TRI for generating a mask signal MSK at a timing corresponding to a unique latency (which corresponds to the CL value of the SDRAM 2), and outputs the trigger signal to the mask generating circuit 11 and a DLL circuit 40. The command control circuit 20 also generates a memory clock MEM_CLK and outputs it to the SDRAM 2 via a buffer 21. The command control circuit 20 may also generate other memory control signals and output them to the SDRAM 2 via buffers 22-1 through 22-M.

The mask generating circuit 11 is started up by the trigger signal TRI and produces the mask signal MSK synchronized with the internal clock CLK. The mask generating circuit 11 also includes a delay circuit for producing the mask signal MSK delayed by a delay time designated by a control signal from the CPU 30.

Figure 3A:
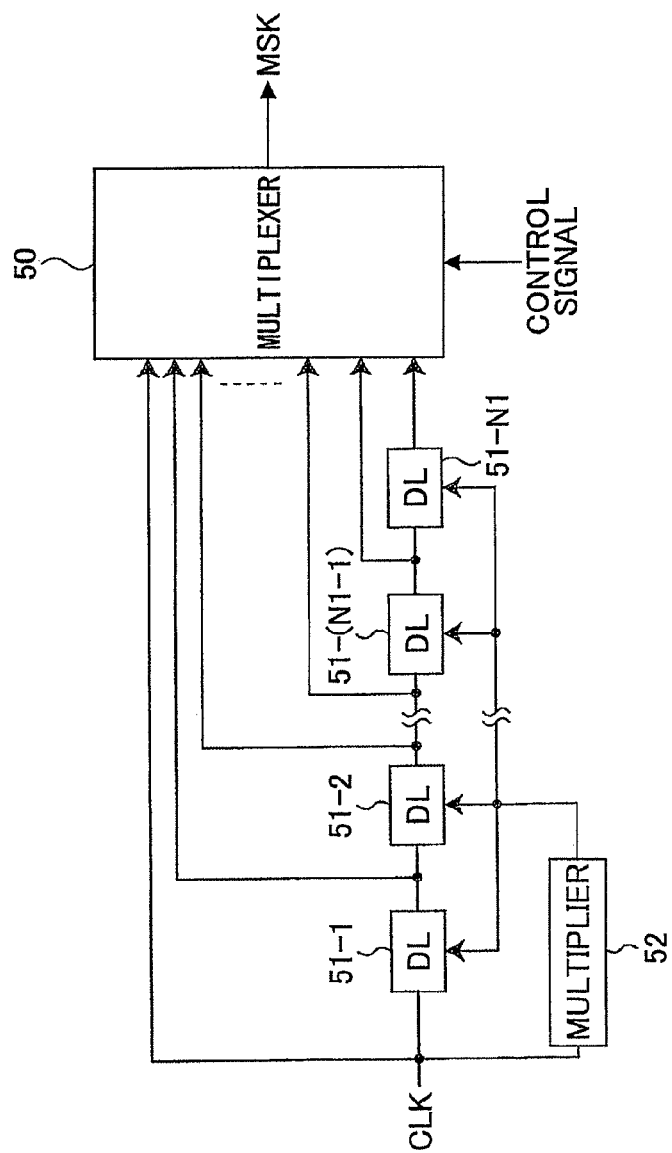
FIG. 3A is a block diagram of a mask generating circuit of the memory control system of FIG. 2.

FIG. 3A is a block diagram of the mask generating circuit 11. The mask generating circuit 11 includes a delay circuit having a series connection of a plurality (N1) of delay lines 51-1 through 51-N1. The mask generating circuit 11 also includes a multiplier 52 configured to multiply the internal clock CLK by a predetermined multiplication factor (which may be 20 or 40) and output the product to the delay lines 51-1 through 51-N1 as an operation clock. The mask generating circuit 11 also includes a multiplexer 50 configured to switch, based on a control signal, between the internal clock CLK as is or an output signal of one of the delay lines 51-1 through 51-N1 for an output as the mask signal MSK.

Thus, the mask generating circuit 11 is capable of delaying the clock CLK by a value (i.e., by a period shorter than that of the clock CLK) obtained by dividing the internal clock CLK by the multiplication factor and outputting the delayed clock CLK. The mask signal MSK from the mask generating circuit 11 is inputted into a second input terminal of a mask AND gate 12, and also into a timing measuring circuit 13 via a contact b of a switch SW.

Only the strobe signal DQS is obtained from a buffer 15 to which the strobe signals DQS and DQSB from the SDRAM 2 are inputted. The strobe signal DQS is inputted into a first input terminal of the mask AND gate 12 and also into the timing measuring circuit 13 via a contact a of the switch SW. The AND gate 12 masks the inputted strobe signal DQS in accordance with the mask signal MSK, and produces a masked strobe signal DQSM which is outputted to a read data control circuit 10 and a first edge detecting circuit 14. The read data control circuit 10 may include a circuit well known in the art for controlling a read such that the data DQ from the SDRAM 2 can be latched at the timing of the strobe signal DQS. Numeral 16 designates a buffer for an output signal to the SDRAM 2.

The first edge detecting circuit 14 detects the first rise of the inputted masked strobe signal DQSM based on the internal clock CLK, and outputs the internal clock CLK to the timing measuring circuit 13 in synchronism with the detection. During a coarse adjustment and a fine adjustment of the mask timing, the switch SW is switched to the contact a so that the timing measuring circuit 13 can latch the inputted strobe signal DQS at the timing of the clock inputted from the first edge detecting circuit 14. The timing measuring circuit 13 outputs output data TMD (Q0 through QN) after a serial-parallel conversion. During calibration of the mask timing, the switch SW is switched to the contact "b" so that the timing measuring circuit 13 can latch the inputted mask signal MSK and output the data TMD (Q0 through QN) after a serial-parallel conversion.

FIG. 3B is a block diagram of the timing measuring circuit 13. The timing measuring circuit 13 includes a delay circuit having a series connection of plural (N2) delay lines 61-1 through 61-N2. The timing measuring circuit 13 also includes a number (N2+1) of D-type flip-flops 62-0 through 62-N2 for latching the data from the input terminals or output terminals of the delay lines 61-1 through 61-N2, and an input buffer 63.

The internal clock CLK is inputted into the delay lines 61-1 through 61-N2 and the D-type flip-flops 62-0 through 62-N2 via the input buffer 63. The timing measuring circuit 13 latches the inputted strobe signal DQS or the mask signal MSK and the output data TMD (Q0 through QN) after serial-parallel conversion.

Figure 4:
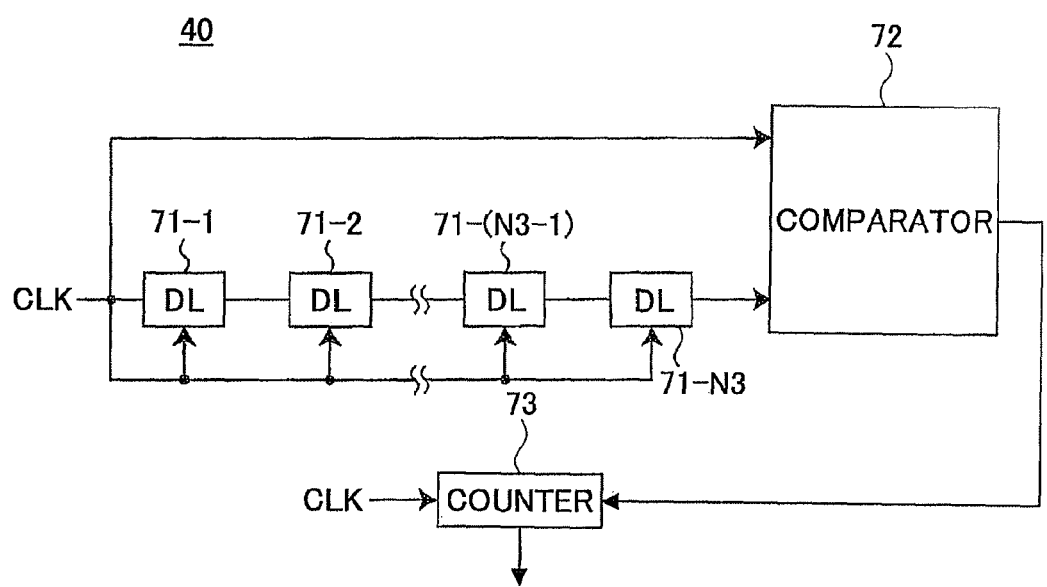
FIG. 4 is a block diagram of a DLL (Delay Locked Loop) circuit of the memory control system of FIG. 2.

The memory control system of FIG. 2 also includes, in addition to the CPU 30, the DLL circuit 40 illustrated in FIG. 4 for controlling the mask timing and comparators 31 through 33. The structure and operation of these components will be described later.

Figures 5A, 5B:
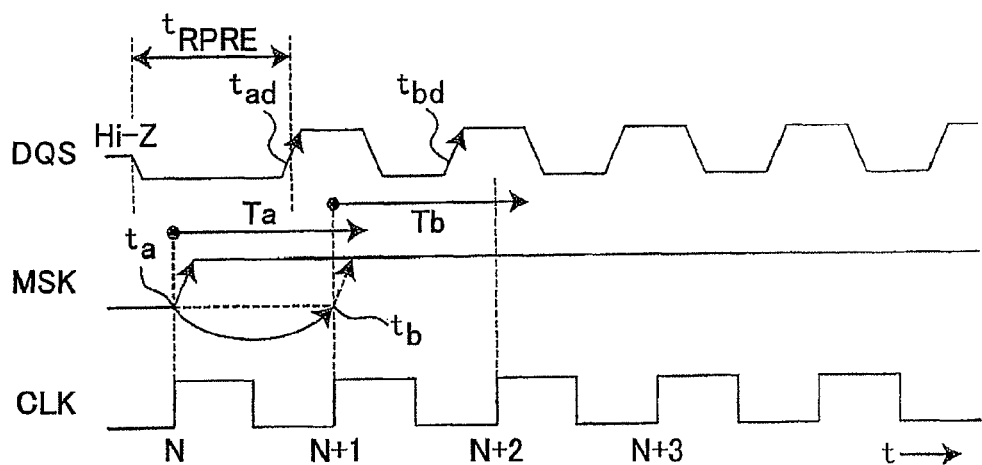
FIG. 5A is a timing chart of a coarse adjusting process for a mask timing in the memory control system of FIG. 2.
FIG. 5B illustrates examples of output data of the timing measuring circuit.

FIG. 5A is a timing chart of the coarse adjusting process (i.e., an adjustment on the clock period basis) for the mask timing in the memory control system of FIG. 2. FIG. 5B illustrates examples of output data $TMD(t_a)$ from the timing measuring circuit 13 when the mask signal MSK rises at time $t_a$ in FIG. 5A, and output data $TMD(t_b)$ of the timing measuring circuit 13 when the mask signal MSK rises at time $t_b$. In FIG. 5B, "x" may be "1" or "0". In the present disclosures, the time $t_a$ corresponds to the rising of the N-th clock CLK (N-th CLK setting) which may be designated "(N)CLK". The time $t_b$ corresponds to the rising of the N+1-th clock CLK (N+1-th CLK setting) which may be designated "(N+1)CLK".

In the example of FIGS. 5($a$) and 5($b$), when the switch SW is switched to the contact a so that the strobe signal DQS is inputted into the timing measuring circuit 13, the clock outputted by the first edge detecting circuit 14 upon rising of the mask signal MSK at the time $t_a$ is a signal corresponding to the strobe signal $DQS(t_a)$. In this case, the range in which the mask signal MSK can be delayed by the mask generating circuit 11 corresponds to a period Ta indicated by an arrow in FIG. 5A, where the dot on the left end of the arrow corresponds to a minimum delay setting and the right end of the arrow corresponds to a maximum delay setting. The range may be at least the same as the clock CLK period. Thus, the output data TMD from the timing measuring circuit 13 corresponding to the mask signal $MSK(t_a)$ is the output data TMD ($t_a$=(N−1)CLK) (FIG. 5B) from the timing measuring circuit 13. The timing of the mask signal $MSK(t_b)$ is similar; i.e., the range in which the mask signal MSK can be delayed corresponds to a period Tb indicated by an arrow in FIG. 5A. Thus, the output data TMD from the timing measuring circuit 13 corresponding to the mask signal $MSK(t_b)$ is the output data TMD ($t_b$=(N)CLK) (FIG. 5B) from the timing measuring circuit 13.

As illustrated in FIG. 5B, in the case of the output data TMD ($t_a$=(N−1)CLK) of the timing measuring circuit 13, a succession of 0's can be seen because the mask signal MSK rose in the preamble period $t_{RPRE}$ of the strobe signal DQS. In the case of the output data $TMD(t_b$=(N)CLK) from the timing measuring circuit 13, a succession of 0's can be seen following a succession of 1's because the mask signal MSK rose after the first rising of the strobe signal DQS. This also means that the pulses of the strobe signal DQS are visible.

For example, when the timing of the mask generating circuit 11 is set at time $t_b$=(N)CLK, a succession of 0's may be observed in the output data TMD from the timing measuring circuit 13, and then, when the timing of the mask generating circuit 11 is set at the time $t_c$=(N+1)CLK, a pulse of the strobe signal DQS is observed in the output data TMD from the timing measuring circuit 13. When the timing of the mask generating circuit 11 is set at the time $t_d$=(N+2)CLK, a succession of 0's may be observed corresponding to the pulse period (a sum of the successive 1's and the successive 0's) of the strobe signal DQS in the output data TMD from the timing measuring circuit 13. In this case, the successive 0's may be determined to correspond to the preamble period $t_{RPRE}$ (which is the same as the pulse period of the strobe signal DQS).

Thus, the coarse adjusting process can be performed on the clock period basis for the mask timing by using the mask generating circuit 11, the first edge detecting circuit 14, the timing measuring circuit 13, and the DLL circuit 40.

FIG. 4 is a block diagram of the DLL (Delay Locked Loop) circuit 40 of FIG. 2. In FIG. 4 the DLL circuit 40 includes a delay circuit having a series connection of a number N3 of delay lines 71-1 through 71-N3 which are started up in response to a trigger signal TRI. The delay lines 71-1 through 71-N3 are configured to be successively delayed in synchronism with the inputted clock. The DLL circuit 40 also includes a comparator 72 for comparing the clock CLK signal with the output signal from the delay circuit. When the clock CLK signal corresponds with the output signal from the delay circuit, a counter 73 counting the clock CLK is locked, and the instantaneous counter value is outputted to the CPU 30, thus enabling the acquisition of the number of units of delay at the time of locking. The "unit of delay" herein refers to the delay time of a single delay line. For example, when a pattern "01111 . . . 111110" is inputted, the counter 73 is locked upon detection of the correspondence between the initial "0" and the last "0" by the comparator 72, thus acquiring the number of 1's as the counter value of the counter 73.

In the example of FIG. 4, the DLL circuit 40 is fed with the internal clock CLK as a reference clock. The unit of delay of the delay lines 71-1 through 71-N3 of the delay circuit of the DLL circuit 40 is the same as the unit of delay of the delay lines 61-1 through 61-N2 of the timing measuring circuit 13 of FIG. 3B, and also the unit of delay of the delay lines 51-1 through 51-N1 in the mask generating circuit 11.

The reference frequency of the DLL circuit 40 may be an integral multiple or submultiple of the clock CLK. The unit of delay of the delay lines 71-1 through 71-N3 of the delay circuit of the DLL circuit 40 may be an integral multiple or submultiple of the unit of delay of the delay lines 61-1 through 61-N2 in the timing measuring circuit 13 of FIG. 3B, or the unit of delay of the delay lines 51-1 through 51-N1 of the mask generating circuit 11.

The counter value (i.e., the number of units of delay upon locking) of the counter 73 of the DLL circuit 40 corresponds to the reference clock period. Thus, the counter value is outputted to the comparator 31 of FIG. 2 (the processing by the comparator 31 may be realized as software processing in the CPU 30) and compared with the output data TMD from the timing measuring circuit 13 of FIG. 3B. In this way, the preamble period $t_{RPRE}$ of the output data TMD($t_a$) and TMD ($t_b$) from the timing measuring circuit 13 of FIG. 3B, or the pulse period of the strobe signal DQS can be accurately confirmed.

For example, in the configuration in which the clock CLK is inputted into the delay circuit of the DLL circuit 40 as the reference input signal, when the counter value of the counter 73 is "32", the number of successive 0's in the output data TMD($t_a$) from the timing measuring circuit 13 of FIG. 5B is around 32. This means that the number of 0's of the clock period has been measured, thus accurately determining that the clock period corresponds to the preamble period $t_{RPRE}$.

Next, the calibration process for the mask timing when the switch SW is switched to the contact b is described. The calibration process is performed by using the comparators 32 and 33 of FIG. 2. The processing by the comparators 32 and 33 may be realized as a software process in the CPU 30.

Figure 6:
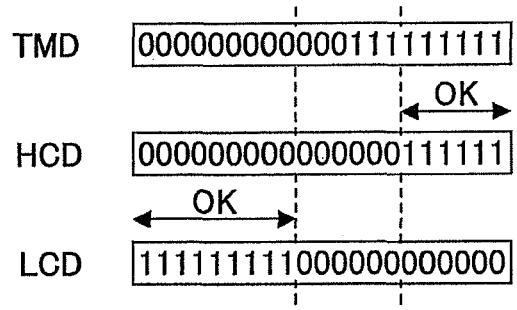
FIG. 6 illustrates a fine-adjusting process for a mask timing in the memory control system of FIG. 2.
Figure 7:
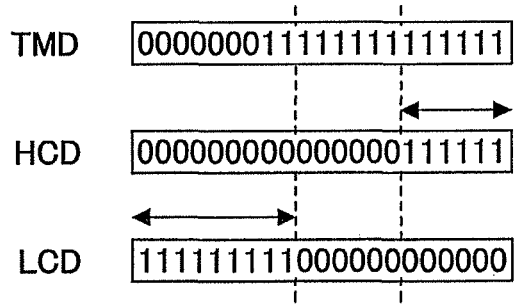
FIG. 7 illustrates an example of adjustment failure (NG) in the fine-adjusting process for the mask timing of the memory control system of FIG. 6.

FIG. 6 illustrates examples of output data TMD from the timing measuring circuit 13, high-level comparison data HCD, and low-level comparison data LCD during the fine-adjusting process for the mask timing in the memory control system of FIG. 2. FIG. 7 illustrates examples where a comparison result is determined to be not good "NG" (adjustment failure) when, in the mask timing fine-adjusting process in the memory control system of FIG. 6, the output data TMD from the timing measuring circuit 13 is compared with the low-level comparison data LCD.

As illustrated in FIG. 6, the high-level comparison data HCD and the low-level comparison data LCD are provided as comparison data, which are inputted into the comparators 32 and 33, respectively. The high-level comparison data HCD is compared with the output data TMD from the timing measuring circuit 13 by the comparator 32, and a comparison result is inputted into the CPU 30. The CPU 30 determines that the comparison result is OK when the output data TMD from the timing measuring circuit 13 corresponding to bits "1" are all "1"; if not, the comparison result is determined to be NG.

The low-level comparison data LCD is compared with the output data TMD from the timing measuring circuit 13 by the comparator 33, and a comparison result is inputted into the CPU 30. The CPU 30 determines that the comparison result is "OK" when all of the timing measuring circuit output values corresponding to the bits "1" are "0"; if not, it determines that the comparison result is NG. Thus, the CPU 30 does not perform the mask timing control when the comparison results from both the comparators 32 and 33 are OK; if the comparison result from either one is NG, the CPU 30 performs the mask timing control. FIG. 7 illustrates examples where the comparison result is determined to be NG upon comparison with the low-level comparison data LCD.

Thus, the rise timing of the mask signal MSK can be centered in the middle of the preamble period $t_{RPRE}$. Namely, when the comparison result is determined to be "NG", the CPU 30 reads the output data from the timing measuring circuit 13, and sets the delay amount of the delay circuit of the mask generating circuit 11 to an appropriate value depending on the result. Thus, the CPU 30 controls the mask generating circuit 11 based on the comparison result from the comparators 32 and 33 and the output data from the timing measuring circuit 13 such that the rise timing of the mask signal MSK is centered in the middle of the preamble period $t_{RPRE}$ (fine-adjusting process).

Figure 8:
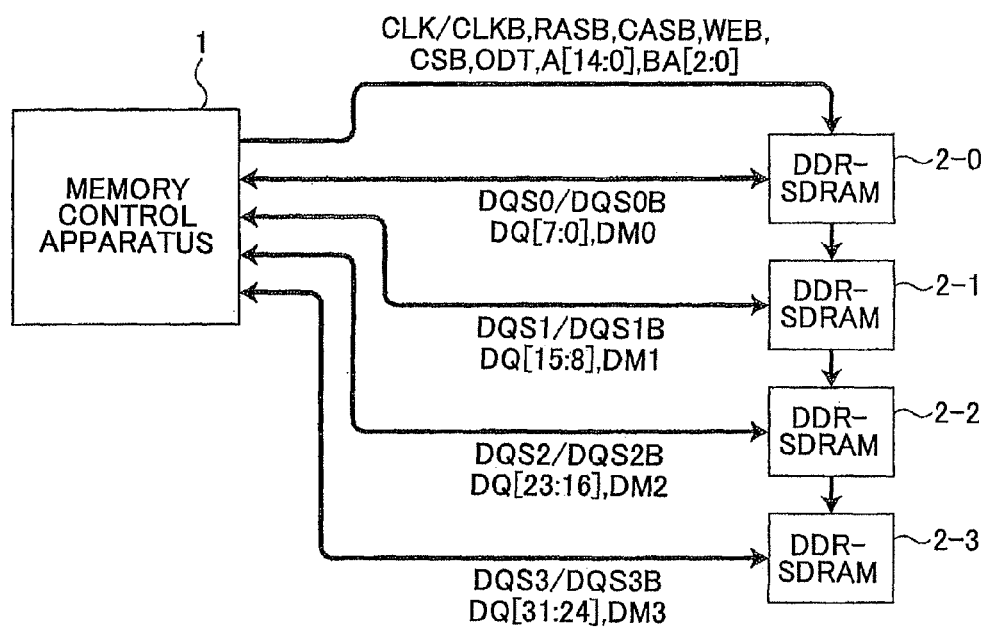
FIG. 8 illustrates the memory control apparatus of FIG. 2 connected to four SDRAMs in a fly-by topology.

FIG. 8 is a block diagram of the memory control apparatus 1 of FIG. 2 to which four SDRAMs 2-0 through 2-3 are connected in a fly-by topology (variation). In accordance with this variation, plural (four in the example of FIG. 8) of the memory control apparatuses 1 of FIG. 2 are provided, and the SDRAMs 2-0 through 2-3 are provided for the corresponding memory control apparatuses. In the example of FIG. 8, the signal lines for memory control signals, such as the memory clock, are connected in fly-by topology in order to supply the signals to the SDRAMs 2-0 through 2-3. On the other hand, the data bus and the strobe signal DQS are supplied to the SDRAMs 2-0 through 2-3 individually.

In this circuit, the unit-clock-based timing adjustment of the mask signal MSK and the delay adjustment by the delay circuit of the mask generating circuit 11 can be performed individually on a data byte basis. In this configuration, the memory control apparatus 1 illustrated in FIG. 8 and the plural SDRAMs 2-0 through 2-3 are connected in fly-by topology. In such a connection, the wiring delays of the strobe signals DQS0 through DQS3 may be varied. Thus, by setting the timing of the mask signal MSK independently on the byte unit basis, the strobe signals DQS for the SDRAMs 2-0 through 2-3 can be individually controlled, so that a stable read reception operation can be performed.

The connection between the SDRAMs 2-0 through 2-3 and the memory control apparatus 1 is not limited to fly-by connection but may include a star connection.

FIG. 9 is a flowchart of a mask timing control process in the memory control system of FIG. 2 which is performed by the CPU 30. First, in step S1, a parameter N is set to "0", and the switch SW is switched to the contact "a" in order to enter into the coarse adjustment mode. In step S2, the mask generating circuit 11 is controlled to adjust the mask timing on the clock period basis such that the mask timing corresponds to the rise of the N-th CLK (in the case of the N-th CLK setting). In step S3, the command control circuit 20 is caused to issue a read memory command. In step S4, the N-th data TMD is acquired from the output of the timing measuring circuit 13 and stored in an internal memory.

In step S5, the preamble is acquired at the time of setting the N−1-th CLK in order to detect the preamble period $t_{RPRE}$. At the same time, it is determined whether the strobe signal DQS that includes a data portion that falls from the high level to the low level upon setting of the N-th CLK is acquired. If "YES", the routine proceeds to step S7. If "NO", the routine proceeds to step S6 where the parameter N is incremented by one and then the routine returns to step S2 to repeat the above process until the condition of step S5 is satisfied.

Figure 10:
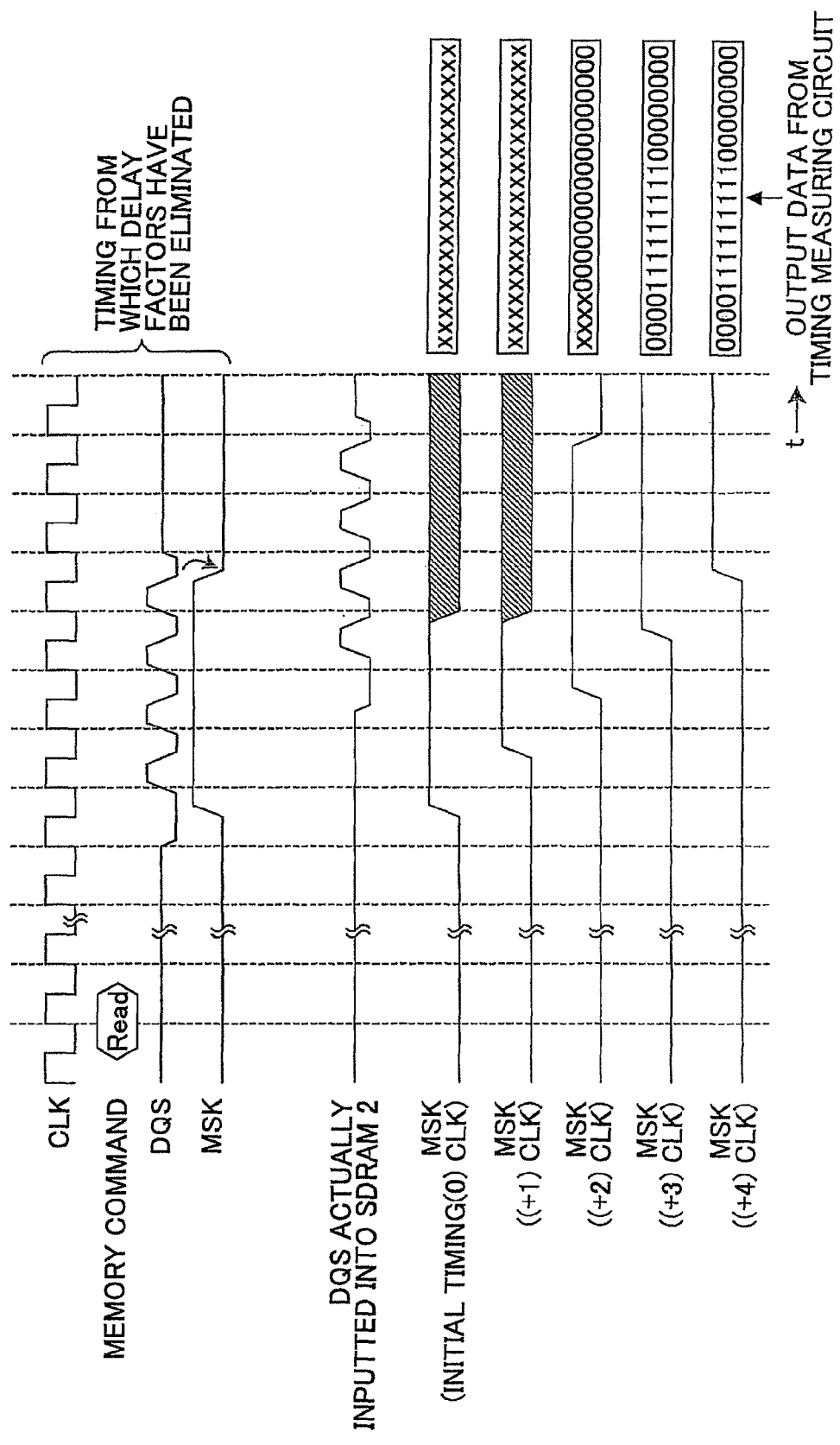
FIG. 10 is a timing chart of an example of a coarse adjusting process for the mask timing of the memory control system of FIG. 2.

In step S7, the mask generating circuit 11 is controlled to perform a coarse adjustment of the mask timing on the clock period basis (only the integer portions) such that the mask timing corresponds to the rise of the N+1-th CLK (in the case of the N+1-th CLK setting) (see FIGS. 5 and 10). In step S8, the command control circuit 20 is controlled to issue a read memory command. In step S9, based on the output data TMD from the timing measuring circuit 13, the mask generating circuit 11 is controlled to perform a fine adjustment of the mask timing on the clock period unit basis (integer portion and fractional portion) by using the DLL circuit 40 (see FIGS. 4 and 11).

Then, in step S10, the switch SW is switched to the contact "b" to enter into the calibration mode. In step S11, based on the output data TMD from the timing measuring circuit 13, the mask generating circuit 11 is controlled such that the mask timing is calibrated by using the comparators 32 and 33 (see FIGS. 6 and 7). In step S12, it is determined wither the calibration control process is to be terminated. If "YES", the mask timing control process is terminated. If "NO", the routine returns to step S11 to repeat the calibration process.

Thus, in accordance with the mask timing control process of FIG. 9, the coarse adjustment, the fine adjustment, or the calibration process is performed on the mask timing so that the mask timing (rise timing of the mask signal MSK) can be centered in the middle of the preamble period $t_{RPRE}$, for example. In this way, the strobe signal DQS can be appropriately masked and controlled.

FIG. 10 is a timing chart of an operation of the coarse adjusting process for the mask timing in the memory control system of FIG. 2 (where the CL value of the SDRAM 2 is 9). The operation of FIG. 10 corresponds to the steps S1 through S7 of the coarse adjusting process for the mask timing illustrated in FIG. 9. From FIG. 10, it can be known in which state of the strobe signal DQS the mask signal MSK was caused to rise by the adjustment of the mask timing on the clock period basis.

It FIG. 10, in the case of the (+4)CLK and the (+3)CLK, pulses of the strobe signal DQS are observed. In the case of the (+2)CLK, it is seen that the succession of 0's corresponds the preamble period $t_{RPRE}$. In the case of the initial timing ((0)CLK) and (+1)CLK, the strobe signal DQS is in the Hi-Z state, which is an unstable state. Thus, it is not known what value the output voltage TMD from the timing measuring circuit 13 may have been; i.e., the output voltage TMD has an indeterminate value.

Figure 11:
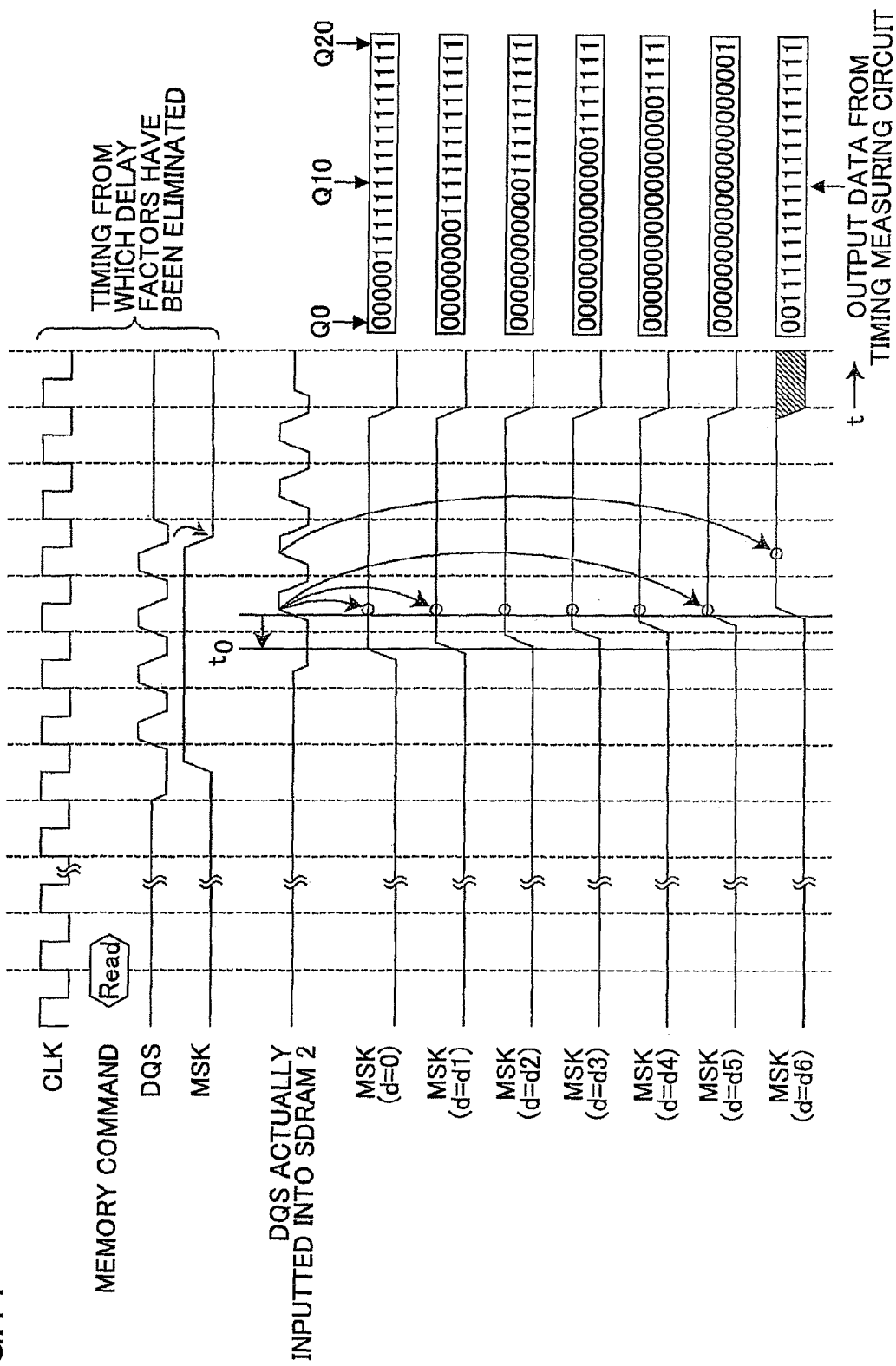
FIG. 11 is a timing chart of another example of the fine-adjusting process for the mask timing of the memory control system of FIG. 2.

FIG. 11 is a timing chart of the fine-adjusting process for the mask timing in the memory control system of FIG. 2 (where the CL value of the SDRAM 2 is 9). FIG. 11 illustrates the case where the delay setting values "d" of the delay circuit in the mask generating circuit 11 are set at 0, d1, d2, . . . , and d6 (which vary by fine values). The time $t_0$ in FIG. 11 corresponds to the rise of the mask signal MSK when the delay setting value of the delay circuit in the mask generating circuit 11 is set at "0". The operation of FIG. 11 corresponds to the steps S8 through S9 of the fine-adjusting process for the mask timing illustrated in FIG. 9.

As illustrated in FIG. 11, by adjusting the delay amount of the delay circuit in the mask generating circuit 11, the mask timing (rise of the mask signal MSK) can be centered in the middle of the preamble period $t_{RPRE}$ (corresponding to the central bit Q10 of the output data TMD (Q0 through Q20) from the timing measuring circuit 13). Thus, the rise of the strobe signal DQS can be adjusted. That the rise of the mask signal MSK is located near the rise of the strobe signal DQS can also be detected by observing the difference (in the varying positions of 0's and 1's) between the mask signal MSK (delay setting value=d5) of FIG. 11 and the mask signal MSK (delay setting value=d6).

In the mask timing control process according to the present embodiment, during the initializing sequence for the memory control apparatus 1 and the SDRAM 2, steps S1 through S7 of the mask timing control process of FIG. 9 are performed. Thereafter, if the comparison result is "NG" as illustrated in FIG. 7 during a read to or a write from the SDRAM 2, the process of step S8 and subsequent steps of FIG. 9 may be performed. In this way, the mask signal MSK can be again caused to rise at an appropriate timing.

The CPU 30 may be notified of the comparison result NG via an interrupting signal. The processing by the comparators 31, 32, and 33 may be performed by software in the CPU 30. Preferably, the delay amount of the delay circuit in the mask generating circuit 11 may be automatically set depending on the comparison result "NG" by using a sequence circuit.

Thus, by the mask timing control process according to the present embodiment, timing adjustment can be made in a small number of steps. Specifically, the timing can be adjusted in a number of steps smaller than that of the initializing sequence in response to variations in power supply voltage or operating temperature. Thus, interference with the read operation or the write operation in the SDRAM 2 can be minimized.

By the mask timing control process according to the present embodiment, the mask signal MSK can be adjusted to rise in the preamble period $t_{RPRE}$ of the strobe signal DQS. Thus, the erroneous capture of an unstable period of the strobe signal DQS for use as a clock CLK can be prevented.

Further, by the mask timing control process according to the present embodiment, as illustrated in FIG. 5A, the preamble period $t_{RPRE}$ or the pulse period of the strobe signal DQS can be accurately confirmed based on the output data TMD ($t_a$) and ($t_b$) from the timing measuring circuit 13.

Further, by the mask timing control process according to the present embodiment, the rise timing of the mask signal MSK can be centered in the middle of the preamble period $t_{RPRE}$.

Further, by the mask timing control process according to the present embodiment, a stable read reception operation can be performed whether the memory control apparatus 1 and the plural SDRAMs 2 are connected by star wiring or fly-by wiring.

The mask timing control process according to the present embodiment provides an adjusting procedure by which, in the initializing sequence of the memory control apparatus 1, stable read reception can be performed. A stable read reception operation can be maintained by minimizing interference with a read operation or a write operation in the SDRAM 2 upon variations of the power supply voltage or temperature. The present invention may be embodied in a memory circuit of a type other than the DDR-SDRAM.

Thus, in accordance with an embodiment, the mask signal MSK can be adjusted to rise in the preamble period $t_{RPRE}$ of the strobe signal DQS. This prevents the erroneous capturing of an unstable period of the strobe signal DQS for use as a clock CLK.

Although this invention has been described in detail with reference to certain embodiments, variations and modifications exist within the scope and spirit of the invention as described and defined in the following claims.

The present application is based on Japanese Priority Application No. 2010-061185 filed Mar. 17, 2010, the entire contents of which are hereby incorporated by reference.

What is claimed is:

1. A synchronous memory control apparatus for enabling the reception of data read from a memory circuit in synchronism with a strobe signal from the memory circuit,
the apparatus comprising:
a mask circuit configured to mask the strobe signal using a mask signal;
a timing measuring circuit configured to delay the strobe signal in plural units of delay and configured to latch data of each of the delayed strobe signals; and
a mask generating circuit configured to generate the mask signal,
wherein the timing measuring circuit latches the data of each of the delayed strobe signals at the first rise edge of the corresponding masked strobe signal,
wherein the mask generating circuit controls the generation of the mask signal in accordance with a signal from a command control circuit of the memory circuit,
wherein the mask generating circuit further includes a delay circuit having plural units of delay,
the mask generating circuit adjusting a start timing of the mask signal in synchronism with an internal clock, and outputting a signal having a delay amount corresponding to a selected unit of delay by the delay circuit as the mask signal.

2. The memory control apparatus according to claim 1, further comprising a DLL (Delay Locked Loop) circuit having a delay circuit including plural units of delay and using the internal clock as a reference,
wherein the unit of delay of the delay circuit in the DLL circuit corresponds to the unit of delay of a delay circuit in the timing measuring circuit or the delay circuit in the mask generating circuit, or to an integer multiple or submultiple of the unit of delay of the delay circuit in the timing detecting circuit or the mask generating circuit.

3. The memory control apparatus according to claim 1, further comprising:
a switch unit configured to select the mask signal instead of the strobe signal as an input signal to the timing measuring circuit; and
a comparing unit configured to detect a preamble period of the strobe signal by comparing output data from the timing measuring circuit with comparison data upon selection of the mask signal by the switch unit.

4. The memory control apparatus according to claim 1, wherein the mask generating circuit is provided for each of a plurality of the strobe signals.

5. A mask timing adjusting method performed in a synchronous memory control apparatus for enabling the reception of data read from a memory circuit in synchronism with a strobe signal from the memory circuit,
the apparatus including a mask circuit configured to mask the strobe signal using a mask signal;
a timing measuring circuit configured to delay the strobe signal in plural units of delay and configured to latch data of each of the delayed strobe signals; and
a mask generating circuit configured to generate the mask signal,
wherein the timing measuring circuit latches the data of each of the delayed strobe signals at the first rise edge of the corresponding masked strobe signal, and
wherein the mask generating circuit controls the generation of the mask signal in accordance with a signal from a command control circuit of the memory circuit,
the mask timing adjusting method comprising:
detecting a preamble period by adjusting the mask signal outputted from the mask generating circuit at a timing synchronized with an internal clock;
adjusting the mask signal outputted from the mask generating circuit in the units of delay of a delay circuit in the mask generating circuit such that the timing of the strobe signal is within the detected preamble period; and
outputting the adjusted mask signal.

6. The mask timing adjusting method according to claim 5, further comprising:
inputting the mask signal instead of the strobe signal as an input signal to the timing measuring circuit;
comparing output data from the timing measuring circuit with comparison data;
based on a result of the comparing, adjusting the mask signal outputted from the mask generating circuit in the units of delay of the delay circuit in the mask generating circuit such that the timing of the mask signal is located at a predetermined position within a detected preamble period; and
outputting the adjusted mask signal.

* * * * *